(12) United States Patent
Roy

(10) Patent No.: US 12,471,411 B2
(45) Date of Patent: Nov. 11, 2025

(54) METHOD FOR MANUFACTURING OPTOELECTRONIC DEVICES

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 334 days.

(21) Appl. No.: 18/140,100

(22) Filed: Apr. 27, 2023

(65) Prior Publication Data

US 2023/0361241 A1    Nov. 9, 2023

(30) Foreign Application Priority Data

May 2, 2022    (FR) ........................... 2204145

(51) Int. Cl.
*H10H 20/01*    (2025.01)
*H01L 21/02*    (2006.01)
*H10F 71/00*    (2025.01)

(52) U.S. Cl.
CPC ..... *H10H 20/018* (2025.01); *H01L 21/02455* (2013.01); *H01L 21/02469* (2013.01); *H10F 71/1257* (2025.01); *H10F 71/1276* (2025.01); *H10F 71/137* (2025.01); *H10H 20/012* (2025.01); *H10H 20/0125* (2025.01); *H10H 20/013* (2025.01); *H10H 20/0133* (2025.01)

(58) Field of Classification Search
CPC ............. H10H 20/018; H10H 20/0125; H10H 20/0133; H10H 20/012; H10H 20/013; H10F 71/1257; H10F 71/1276; H10F 71/139; H10F 71/1272; H01L 21/02455; H01L 21/02469
See application file for complete search history.

(56) References Cited

U.S. PATENT DOCUMENTS

| | | | |
|---|---|---|---|
| 8,865,489 B2 | 10/2014 | Rogers et al. | |
| 9,650,723 B1* | 5/2017 | D'Evelyn | ................. C30B 9/00 |
| 10,903,073 B2* | 1/2021 | Kim | ...................... H01L 21/683 |
| 2004/0259331 A1 | 12/2004 | Ogihara et al. | |
| 2010/0015738 A1 | 1/2010 | Kim | |
| 2015/0021624 A1* | 1/2015 | Meyer | ................ H10D 62/8325 |
| | | | 257/77 |
| 2022/0028907 A1 | 1/2022 | Kapadia et al. | |

OTHER PUBLICATIONS

INPI Search Report and Written Opinion for priority application, FR 2204145, report dated Dec. 15, 2022, 8 pgs.

* cited by examiner

*Primary Examiner* — Jeff W Natalini
*Assistant Examiner* — Brandon C Fox
(74) *Attorney, Agent, or Firm* — Crowe & Dunlevy LLC

(57) ABSTRACT

An optoelectronic device is manufactured by an epitaxial growth, on each first layer of many first layers spaced apart from each other on a first support, wherein the first is made of a first semiconductor material, of a second layer made of a second semiconductor material. A further epitaxial growth is made on each second layer of a stack of semiconductor layers. Each stack includes a third layer made of a third semiconductor material in physical contact with the second layer. Each stack is then separated from the first layer by removing the second layer using an etching that is selective simultaneously over both the first and third semiconductor materials. Each stack is then transferred onto a second support. Each of the first and third semiconductor materials is one of a III-V compound or a II-VI compound.

14 Claims, 4 Drawing Sheets

METHOD FOR MANUFACTURING OPTOELECTRONIC DEVICES

PRIORITY CLAIM

This application claims the priority benefit of French Application for Patent No. 2204145, filed on May 2, 2022, the content of which is hereby incorporated by reference in its entirety to the maximum extent allowable by law.

TECHNICAL FIELD

The present disclosure generally concerns optoelectronic device manufacturing methods.

BACKGROUND

Semiconductor materials adapted to the forming of optoelectronic components capable of capturing or emitting an infrared radiation comprise III-V compounds. No methods allowing the growth of layers made of a III-V compound by epitaxy directly on a silicon substrate are known.

An example of a method of manufacturing an optoelectronic device comprising optoelectronic components made of III-V compounds comprises the forming of a block made of a III-V compound, the transfer of a layer of the III-V compound from the block onto a support, and the epitaxial growth, from the layer of the III-V compound, of a stack of semiconductor layers made of III-V compounds, in which the optoelectronic components will be formed. Such a method has a high cost, particularly due to the fact that the number of layers of the III-V compound capable of being transferred from a same block is decreased.

There is a need in the art to provide an optoelectronic device manufacturing method overcoming all or part of the disadvantages of existing methods.

There is a need in the art for the manufacturing method to have a low cost.

SUMMARY

An embodiment provides an optoelectronic device manufacturing method comprising the epitaxial growth, on each first layer, of first layers of a first semiconductor material covering a first support and spaced apart from one another, of a second layer made of a second material, and the epitaxial growth, on each second layer, of a stack of semiconductor layers comprising a third layer in physical contact with the second layer, the separation of each stack from the first layer by etching of the second layer by an etching selective both over the first and third materials, and the transfer of the stacks onto a second support, each of the first and third materials being a III-V or a II-VI compound.

According to an embodiment, the method comprises, after the step of separation of each stack from the first layer, the reuse of the first support covered with the first layers for the epitaxial growth, on each first layer, of a new second layer of the second semiconductor material, and the epitaxial growth on each new second layer, of a new stack of semiconductor layers.

According to an embodiment, the second material is a ternary or quaternary compound.

According to an embodiment, the etching used at the step of separation of each stack by etching of the second layer is a wet etching selective over the first and third materials.

According to an embodiment, the lattice parameter of the first, second, and third materials are equal to within 0.1%.

According to an embodiment, each stack further comprises at least one fourth layer of a fourth material, and the etching used at the step of separation of each stack by etching of the second layer is selective simultaneously over the first, third and fourth materials.

According to an embodiment, the second support comprises a wafer comprising a plurality of same electronic circuits, each electronic circuit being covered with a stack from among the stacks after the step of transfer of the stacks onto the second support.

According to an embodiment, the method further comprises the cutting of the wafer to separate the electronic circuits each covered with a stack from among the stacks.

An embodiment also provides an intermediate product comprising a first support covered with first layers of a first semiconductor material spaced apart from one another and comprising, on each first layer, a second layer made of a second material coupled to the first layer by an epitaxy relation and, on each second layer, a stack of semiconductor layers comprising a third layer in physical contact with the second layer and coupled to the second layer by an epitaxy relation, each of the first and third materials being a III-V or II-VI compound, the second material being adapted to being etched selectively over the first and third materials.

According to an embodiment, each stack further comprises at least one fourth layer of a fourth material, the second material being adapted to being etched selectively simultaneously over the first, third, and fourth materials.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. Further, it is here considered that the terms "insulating" and "conductive" respectively signify "electrically insulating" and "electrically conductive".

Unless specified otherwise, the expressions "around", "approximately", "substantially" and "in the order of" signify within 10%, and preferably within 5%. Unless specified otherwise, ordinal numerals such as "first", "second", etc. are only used to distinguish elements from one another. In particular, these adjectives do not limit the described embodiments to a specific order of these elements.

An embodiment of a method of manufacturing optoelectronic devices comprising optoelectronic components with III-V or II-VI compounds will now be described in relation with FIGS. 1 to 10, which are partial simplified cross-section views illustrating the structures obtained at steps of the embodiment of the manufacturing method.

Figure 3:
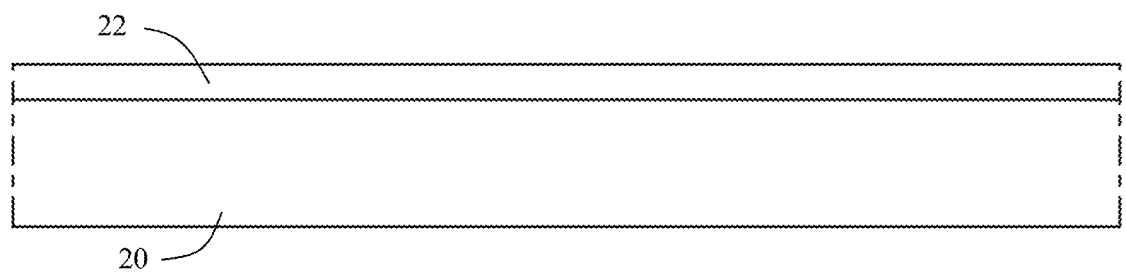
Figure 4:
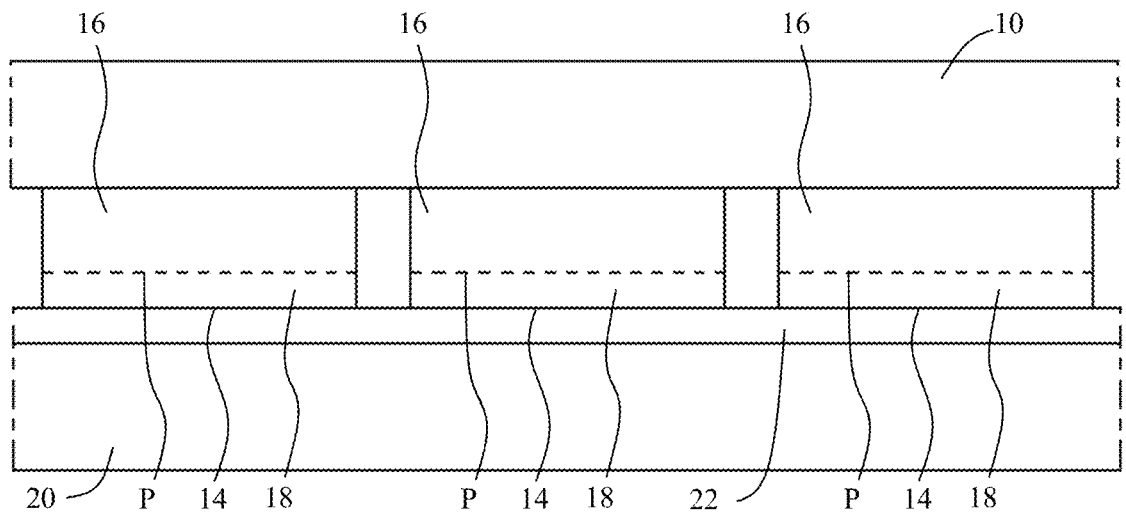
Figure 5:
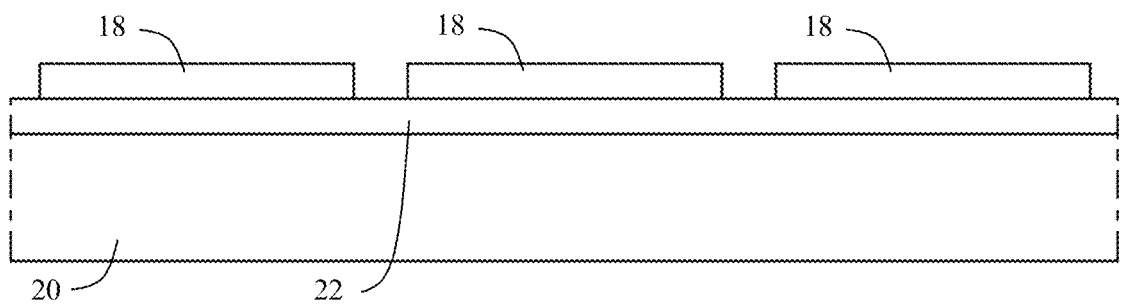

FIGS. 1 to 5 illustrate steps of the embodiment of the manufacturing method which are implemented at the first implementation of the method and result in the obtaining of a support covered with semiconductor layers of FIG. 5. FIGS. 6 to 9 illustrate steps which are implemented during a cycle of optoelectronic device manufacturing from the support covered with semiconductor layers of FIG. 5. FIG. 10 shows a support covered with semiconductor layers obtained after the optoelectronic devices manufacturing cycle illustrated in FIGS. 6 to 9 and that may be used to resume the optoelectronic device manufacturing cycle illustrated in FIGS. 6 to 9.

Figure 1:
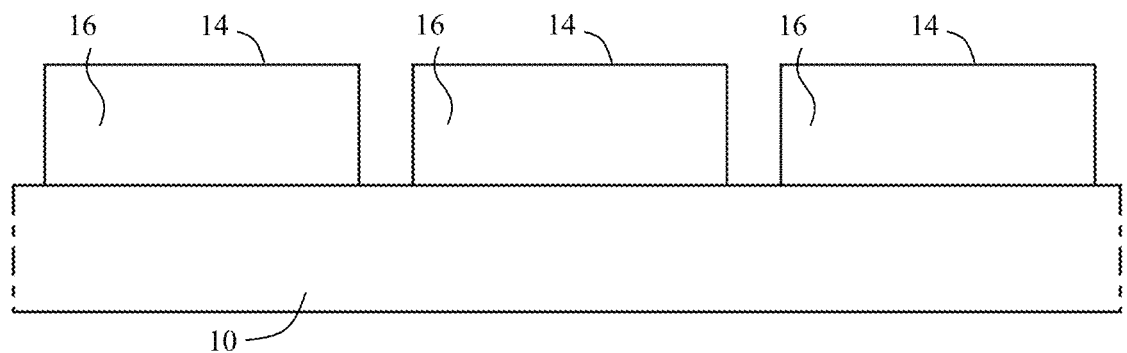
FIGS. 1 to 10 illustrate steps of an embodiment of an optoelectronic device manufacturing method.

FIG. 1 shows the structure obtained after the transfer, onto a support 10, of blocks 16 of a first single-crystal semiconductor material wherein each block a6 has an upper surface 14, three blocks 16 being shown as an example in FIG. 1. Blocks 16 rest on support 10 in physical contact with support 10 spaced apart at a distance from one another. Blocks 16 may be formed by sawing (for example, singulating a wafer of) a donor material. Each block 16 is then individually bonded to support 10. According to an embodiment, the maximum lateral dimension of each block 16 is in the range from 1 mm to 10 mm.

According to an embodiment, the first semiconductor material is a III-V compound or a II-VI compound. Examples of group-III elements comprise gallium (Ga), indium (In), or aluminum (Al). Examples of group-V elements comprise nitrogen (N), phosphorus (P), or arsenic (As). Examples of binary and ternary III-V compounds are AsGa, GaN, AN, InP, InN, InGaN, AlGaN, InGaAs, or AlInGaN. Generally, the elements in the III-V compound may be combined with different molar fractions. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions. The first material may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn).

Figure 2:
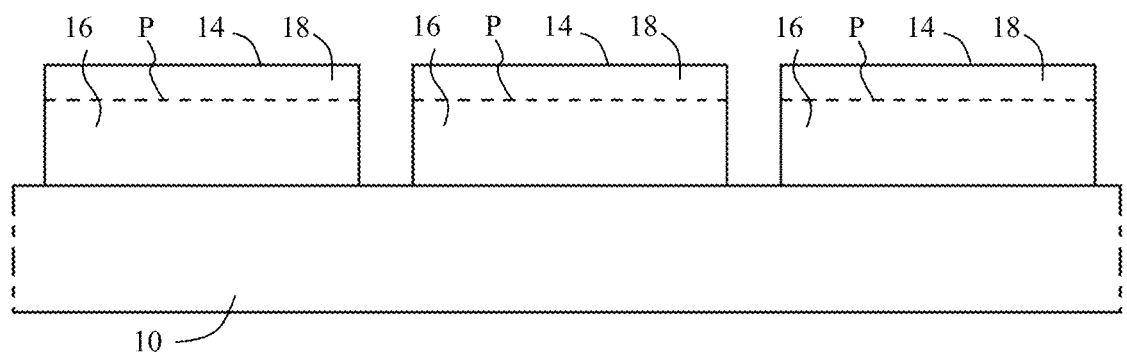

FIG. 2 shows the structure obtained after the forming of a brittle plane P in each block 16. Brittle plane P delimits a semiconductor layer 18 in each block 16 between the free surface 14 of block 16 and brittle plane P.

According to an embodiment, the depth of brittle plane P in each block 16 from the free surface 14 of block 16 is in the range from 200 nm to 3 μm. The forming of brittle plane P may comprise a hydrogen implantation in each block 16 at the level of brittle plane P.

FIG. 3 shows a support 20 covered with an insulating layer 22. According to an embodiment, support 20 corresponds to a silicon wafer conventionally used in microelectronics. As an example, the maximum lateral dimension of support 20 is in the range from 200 mm to 300 mm and the thickness of support 20 is in the range from 600 μm to 800 μm. As a variant, insulating layer 22 may not be present.

FIG. 4 shows the structure obtained after the performing of a molecular bonding between blocks 16 and insulating layer 22. For this purpose, the structure shown in FIG. 2 is applied against the structure shown in FIG. 3 so that the free surface 14 of each block 16 is placed into contact with insulating layer 22.

FIG. 5 shows the structure obtained after the separation, for each block 16, of semiconductor layer 18 from the rest of block 16 by breakage of block 16 at the level of brittle plane P. Single-crystal semiconductor layers 18 of the first material which rest on support 20 in physical contact with insulating layer 22 at a distance from one another are thus obtained. The number of adjacent semiconductor layers 18 particularly depends on the dimensions of support 20. The maximum lateral dimension of each semiconductor layer 18 corresponds to the previously-described lateral dimension of block 16, and is, for example, in the range from 1 mm to 10 mm. According to an embodiment, the number of semiconductor layers 18 on support 20 is in the range from 1 to 4. According to an embodiment, the thickness of each semiconductor layer 18 is in the range from 10 nm to 4 μm.

The method may comprise a treatment of the semiconductor layers 18 present on support 20 to favor subsequent steps of epitaxial growth on semiconductor layers 18. The treatment may comprise the routing of the circumference of semiconductor layers 18 and/or an etching on the side of the upper surfaces of semiconductor layers 18 to remove portions of semiconductor layers 18 having a crystal quality which would not be sufficient for subsequent epitaxial growth steps. The processing may comprise a step of chemical-mechanical planarization (CMP), also called chemical-mechanical etching, which generally combines a chemical and mechanical etching.

Figure 6:
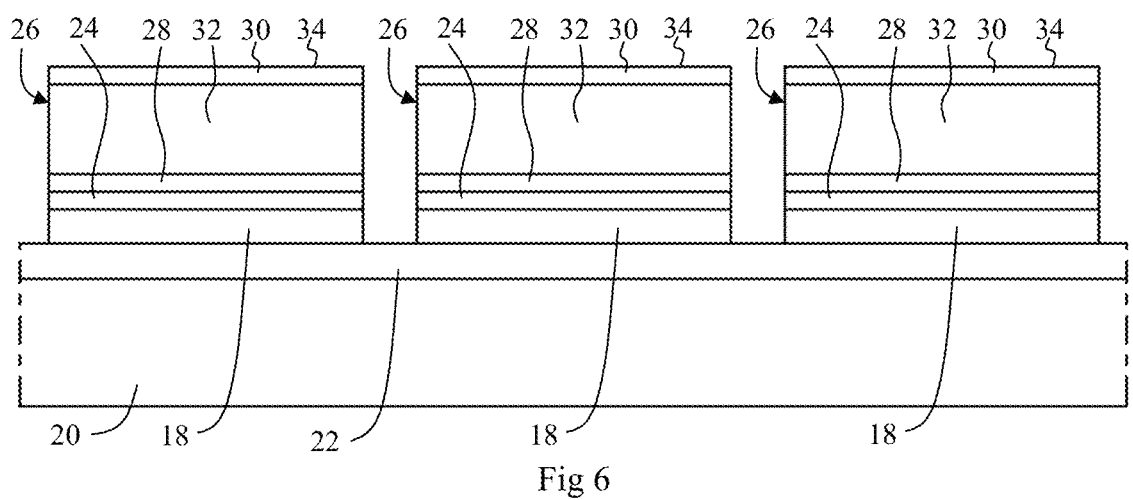

FIG. 6 shows the structure obtained after the epitaxial growth of a single-crystal sacrificial layer 24 made of a second material on each semiconductor layer 18 and after the forming, on each sacrificial layer 24, of a stack 26 of single-crystal semiconductor layers made of III-V or II-VI compounds, in which are subsequently formed at least one optoelectronic component, preferably a plurality of optoelectronic components.

According to an embodiment, the optoelectronic components which are subsequently formed in each stack 26 correspond to photodiodes. According to an embodiment, the optoelectronic components which are subsequently formed in each stack 26 correspond to light-emitting diodes. As an example, each stack 26 comprises first and second semiconductor layers 28 and 30, and an active layer 32 interposed between the two semiconductor layers 28 and 30. First semiconductor layer 28 is located on the side of sacrificial layer 24, in physical contact with sacrificial layer 24, and second semiconductor layer 30 comprises a free surface 34. Semiconductor layers 28 and 30 are layers of a third semiconductor material, which may be identical to the first material.

According to an embodiment, the total thickness of each stack 26 is in the range from 50 nm to 3 μm.

Active layer 32 is the region from which most of the electromagnetic radiation received by the optoelectronic components formed in stack 26 is captured or most of the electromagnetic radiation supplied by the optoelectronic components formed in stack 26 is emitted. According to an embodiment, active layer 32 may comprise confinement means, such as a single quantum well or multiple quantum wells. According to an embodiment, active layer 32 forms a single quantum well. Active layer 32 is then formed of a single-crystal monolayer of a fourth semiconductor material, for example, an alloy of the III-V or II-VI compound and of a third element, particularly InGaAs, having a different bandgap than the first doped semiconductor material. A multiple quantum well structure comprises a stack of semiconductor layers forming an alternation of quantum wells and of barrier layers.

The third semiconductor material forming semiconductor layers 28 and 30 is a III-V compound or a II-VI compound previously defined for the first material. Preferably, the third material is identical to the first material. According to an embodiment, the thickness of semiconductor layer 28 is in the range from 50 nm to 500 nm.

According to an embodiment, the second material forming sacrificial layer 24 is a ternary compound or a quaternary compound. The second material is different from the first material, from the third material, and from the fourth material. The second material is selected to have a lattice parameter, also called lattice constant, close to the lattice parameter of the first material to allow the epitaxial growth of a crystal of the second material from a crystal of the first material. Preferably, the lattice parameters of the first and second materials are equal to within 0.1%. The second material is selected to have a lattice parameter close to the lattice parameter of the third material to allow the epitaxial growth of a crystal of the third material from a crystal of the second material. Preferably, the lattice parameters of the third and second materials are equal to within 0.1%.

The second semiconductor material is a material likely to be selectively etched over the first material, the third material, and the fourth material. The etching of the second material is called selective over the first, third, and fourth material when, in same etch conditions, the etch speed, also called etch rate, for example, expressed in nm/min, of the second material is greater by at least a factor of 200 times than the etch speeds of the first, third, and fourth materials. Preferably, the second semiconductor material is a material likely to be etched by wet chemical etching selectively over the first, third, and fourth materials. According to an embodiment, the thickness of sacrificial layer 24 is in the range from 200 nm to 800 nm.

Figure 7:
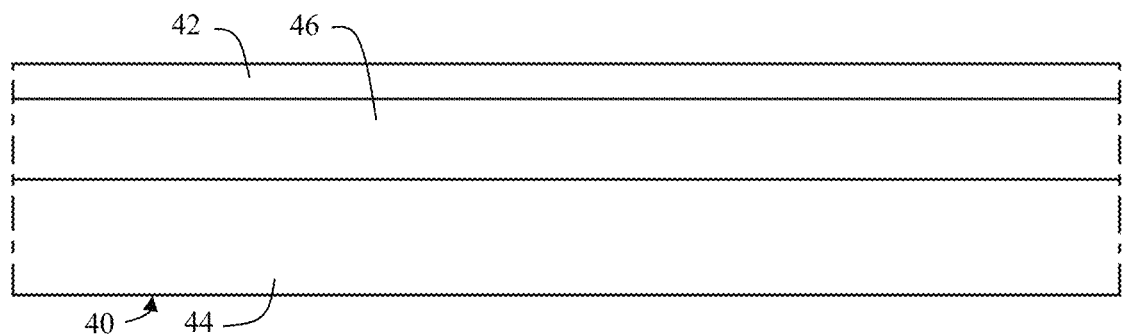

FIG. 7 shows a wafer 40 comprising a plurality of non-separated same electronic circuits and covered with a bonding layer 42. The number of electronic circuits of wafer 40 corresponds to the number of stacks 26 intended to be bonded to wafer 40. Wafer 40 may in particular be formed according to conventional technologies of manufacturing of a wafer of integrated circuits comprising MOS transistors. Wafer 40 may comprise a semiconductor substrate 44 covered with an interconnection structure 46. Interconnection structure 46 particularly enables to connect electronic components of wafer 40, for example, MOS transistors, to one another and to conductive pads at the surface of interconnection structure 46. Interconnection structure 46 comprises a stack of insulating layers having conductive elements, for example, conductive tracks and conductive vias (not shown in FIG. 7), located between and through the insulating layers of the stack, arranged therein. Bonding layer 42 may be a silicon oxide layer ($SiO_2$).

Figure 8:
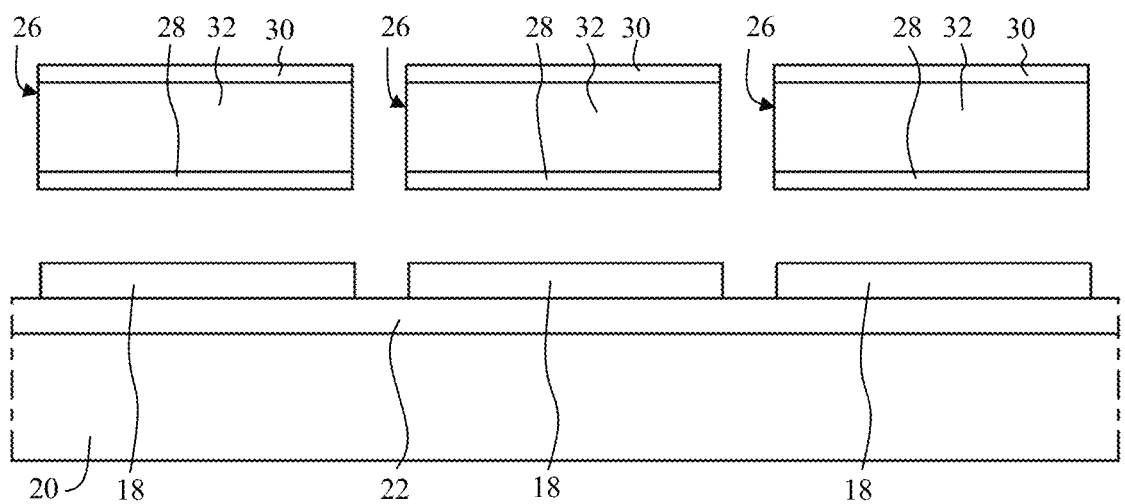

FIG. 8 shows the structure obtained after the separation of the stacks 26 of semiconductor layers 18 for their transfer onto wafer 40. The separation of each stack 26 from the underlying semiconductor layer 18 is obtained by a removal of the sacrificial layer 24 interposed between stack 26 and semiconductor layer 18. According to an embodiment, the removal of sacrificial layer 24 is performed by a selective etching of sacrificial layer 24, for example a wet chemical etching. The stacks 26 separated from semiconductor layers 18 may be displaced via a handle, not shown in FIG. 8.

Figure 9:
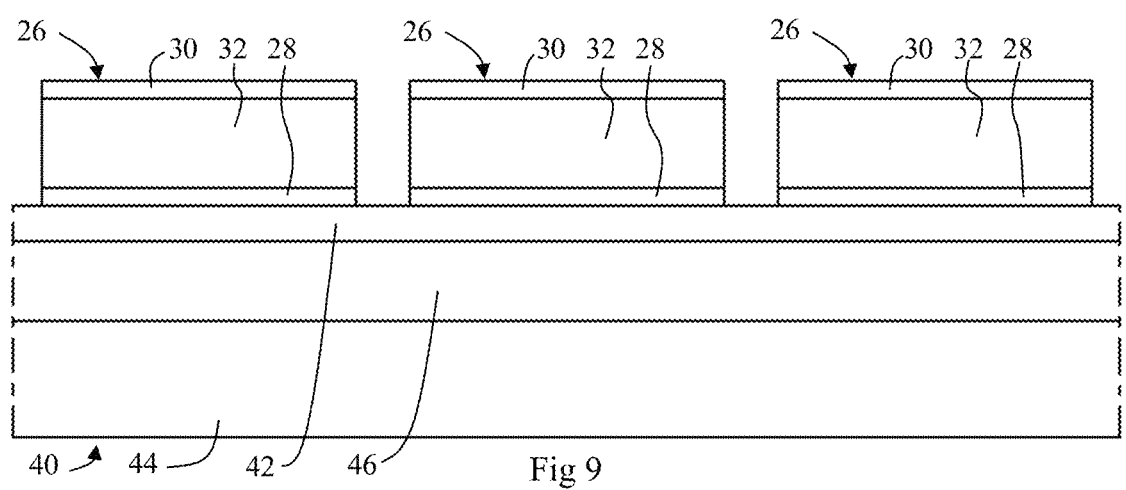
Figure 10:
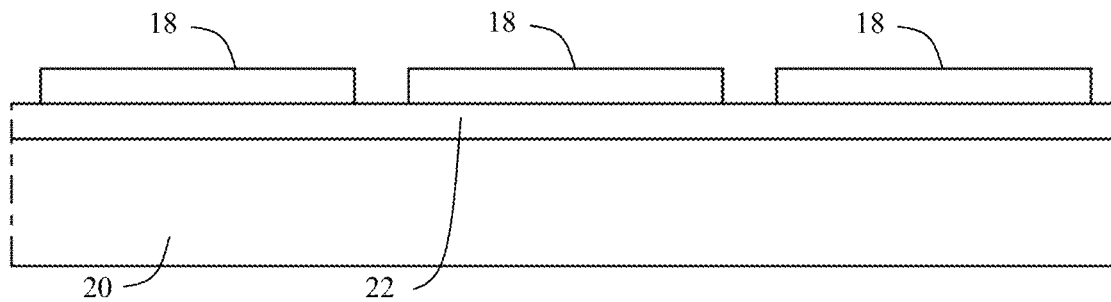

FIG. 9 shows the structure obtained after the bonding of stacks 26 to wafer 40. Stacks 26 which rest on wafer 40 in physical contact with bonding layer 42 at a distance from one another are thus obtained. According to an embodiment, the bonding of stacks 26 to bonding layer 42 may comprise a step of collective transfer by micro transfer printing.

The manufacturing method may comprise subsequent steps for the forming of a plurality of optoelectronic devices, each optoelectronic device comprising a stack 26 and the underlying electronic circuit of wafer 40, and the separation of the optoelectronic devices from one another. The manufacturing method may particularly comprise a step of forming of optoelectronic components in the stacks particularly comprising the forming of the doping areas, of the etching areas, and of the areas containing the metal electrodes of the optoelectronic components.

FIG. 10 is a partial simplified cross-section view of the structure obtained after the separation of each stack 26 from support 20 illustrated in FIG. 8. FIG. 8 is identical to FIG. 5. Thereby, the structure shown in FIG. 10 may be used for the forming of new optoelectronic devices, particularly by the implementation of the steps previously described in relation with FIGS. 6 to 9. According to an embodiment, the same structure shown in FIG. 10 may be used (i.e., re-used) many times, for example at least ten times, preferably at least fifty times, more preferably at least one hundred times, for the implementation of the method described in relation with FIGS. 6 to 9.

Figure 11:
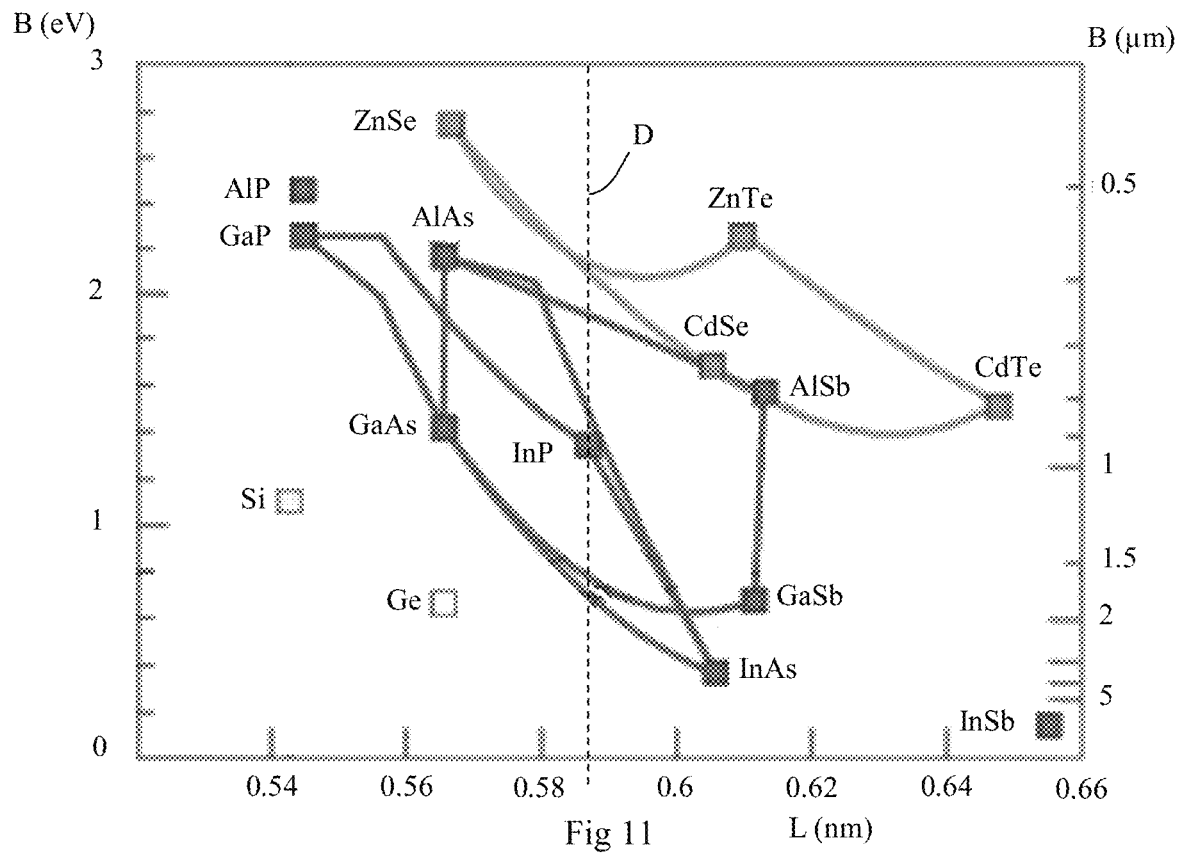
FIG. 11 is a phase diagram.

FIG. 11 shows a phase diagram illustrating a method of selection of the second material forming sacrificial layer 24. The phase diagram illustrates, for different semiconductor materials, the bandgap B of the material according to the lattice constant L of the material expressed in nanometers (nm). Bandgap B is expressed in electrons-volts (eV) on the axis of ordinates on the left-hand side and in micrometers (μm) on the axis of ordinates on the right-hand side.

In FIG. 11, each square corresponds to an element or to a binary component having its chemical formula indicated next to the square. Certain squares corresponding to two binary components having an element in common are coupled by a curve which then corresponds to a ternary compound comprising the three elements of the two binary compounds. As an example, the curve which links the square corresponding to binary compound GaAs and the square corresponding to binary compound InAs corresponds to ternary compound $In_xGa_{1-x}As$, where x is a real number varying from 0 to 1 according to the considered point in the curve.

According to an embodiment, when the first material forming semiconductor layer 18 and the third material forming semiconductor layers 28 and 30 is InP and the fourth material forming active layer 32 is InGaAs, to be able to grow by epitaxy sacrificial layer 24 on InP layer 18, as previously described in relation with FIG. 6, it is necessary for the lattice parameter L of the second material to be close to the lattice parameter L of binary compound InP.

In FIG. 11, this means that when drawing a line D parallel to the axis of ordinates and running through the square corresponding to binary compound InP, the coefficient x of the ternary compound $In_xGa_{1-x}As$ of layer 32 is close to that of the ternary compound located at the intersection of line D and of the curve which links the square corresponding to binary compound GaAs and the square corresponding to binary compound InAs.

A method of selection of the material forming sacrificial layer 24 comprises the search for a ternary or quaternary compound on the line D parallel to the axis of ordinates and running through the square corresponding to the first material, in the present example InP. The second material should further be able to be etched selectively over the first material (binary compound InP), to the third material (binary compound InP), and to the fourth material (ternary compound InGaAs). In the present example, it may be a ternary compound InAlAs, InAlP, AlGaS, AlAsSb, ZnSeCd, ZnSeTe, or GaAsSb, or even a quaternary compound InAlGaAs. Indeed, for such compounds, an etching based on iron (III) chloride hydrate ($FeCl_3:H_2O$) is selective over binary compound InP and ternary compound InGaAs.

The embodiment of the manufacturing method previously described in relation with FIGS. 1 to 10 may be implemented for the manufacturing of optoelectronic devices particularly corresponding to infrared image sensors or visible light image and infrared image sensors.

Figure 12:
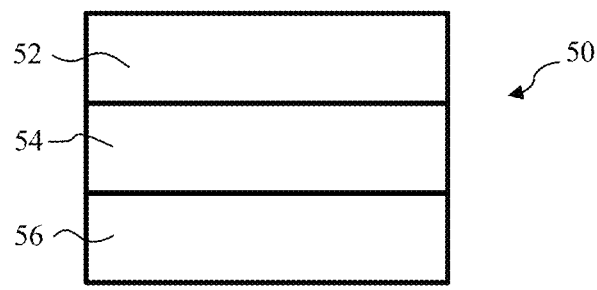
FIG. 12 is a partial simplified cross-section view of an embodiment of an optoelectronic device.

FIG. 12 is a partial simplified cross-section view of an embodiment of an optoelectronic device 50 comprising a stack of a first electronic circuit 52, of a second electronic circuit 54, and of a third electronic circuit 56. Second electronic circuit 54 is interposed between first electronic circuit 52 and third electronic circuit 56. First electronic circuit 52 comprises optoelectronic components, for example, photodiodes, based on silicon. Second electronic circuit 54 comprises optoelectronic components, for example, photodiodes made of III-V or II-VI compounds. Third electronic circuit 56 comprises electronic components, particularly MOS transistors, for the control of the optoelectronic components made of III-V or II-VI compounds and of the optoelectronic components based on silicon. According to an embodiment, second electronic circuit 54 is bonded to this electronic circuit 56 by hybrid molecular bonding.

According to an embodiment, the manufacturing of the stack comprising first electronic circuit 52 and second electronic circuit 54 may implement the embodiment of the manufacturing method previously described in relation with FIGS. 1 to 10. First electronic circuit 52 corresponds to the previously-described electronic circuit 40 and second electronic circuit 54 comprises one of the previously-described stacks 26.

Various embodiments and variants have been described. It will be understood by those skilled in the art that certain features of these various embodiments and variations may be combined and other variations will occur to those skilled in the art.

Finally, the practical implementation of the embodiments and variants described herein is within the capabilities of those skilled in the art based on the functional indications provided hereinabove.

The invention claimed is:

1. A manufacturing method, comprising:
providing a plurality of first layers covering a first support;
wherein each first layer is made of a first semiconductor material;
wherein the first layers are spaced apart from each other;
epitaxially growing, on each first layer, a second layer made of a second semiconductor material;
epitaxially growing, on each second layer, a stack of semiconductor layers;
wherein said stack of semiconductor layers comprises a third layer made of a third semiconductor material in physical contact with the second layer;
etching the second layer to separate each stack of semiconductor layers from the first layer;
wherein said etching is selective simultaneously over both the first and third semiconductor materials; and
transferring each separated stack of semiconductor layers onto a second support;
wherein each of the first and third semiconductor materials is one of a III-V compound or a II-VI compound.

2. The method according to claim 1, further comprising, after separating, reusing the first support covered with the plurality of first layers to repeat the steps of:
epitaxially growing, on each first layer, the second layer;
epitaxially growing, on each second layer, the stack of semiconductor layers;
separating each stack of semiconductor layers from the first layer by etching the second layer; and
transferring each separated stack of semiconductor layers onto the second support.

3. The method according to claim 1, wherein the second semiconductor material is one of a ternary compound or a quaternary compound.

4. The method according to claim 1, wherein said etching is a wet etching of the second layer, said wet etching being is selective over the first and third semiconductor materials.

5. The method according to claim 1, wherein lattice parameters of the first, second, and third semiconductor materials are equal to within 0.1%.

6. The method according to claim 1, wherein each stack of semiconductor layers further comprises at least one fourth layer made of a fourth semiconductor material, and wherein said etching is selective simultaneously over the first, third, and fourth semiconductor materials.

7. The method according to claim 1, further comprising:
forming the second support as a wafer comprising a plurality of electronic circuits; and
wherein transferring comprises covering each electronic circuit with one stack of semiconductor layers.

8. The method according to claim 7, further comprising cutting the wafer to separate the electronic circuits from each other, wherein each electronic circuit is covered with one stack of semiconductor layers.

9. The method according to claim 7, wherein each stack of semiconductor layers forms an optoelectronic component.

10. The method according to claim 9, wherein the optoelectronic component is a photodiode.

11. The method according to claim 9, wherein the optoelectronic component is a light-emitting diode.

12. The method according to claim 7, wherein forming the second support comprises providing an oxide layer extending over the plurality of electronic circuits and wherein transferring comprises bonding each stack of semiconductor layers to said oxide layer.

13. An intermediate product, comprising:
a first support;
a plurality of first layers on said first support spaced apart from one another;
wherein each first layer is made of a first semiconductor material;
a second layer made of a second material on each first layer;
wherein said second layer is made of a second semiconductor material epitaxially coupled to the first layer;
a stack of semiconductor layers in physical contact with each second layer;

wherein each stack of semiconductor layers comprises a third layer;
wherein said third layer is made of a third semiconductor material epitaxially coupled to the second layer;
wherein each of the first and third semiconductor materials is a III-V compound or a II-VI compound; and
wherein the second semiconductor material is selectively etchable simultaneously over both the first and third semiconductor materials.

14. The intermediate product according to claim 13, wherein each stack further comprises a fourth layer made of a fourth semiconductor material, and wherein the second semiconductor material is selectively etchable simultaneously over the first, third, and fourth semiconductor materials.

* * * * *